US012772648B2

(12) United States Patent
Knight

(10) Patent No.: US 12,772,648 B2
(45) Date of Patent: Oct. 20, 2026

(54) LIGHT TRAPPING DEVICE FOR THIN FILM SPACE PHOTOVOLTAICS

(71) Applicant: NORTHROP GRUMMAN SYSTEMS CORPORATION, Falls Church, VA (US)

(72) Inventor: Thomas J. Knight, Silver Spring, MD (US)

(73) Assignee: NORTHROP GRUMMAN SYSTEMS CORPORATION, Falls Church, VA (US)

( * ) Notice: Subject to any disclaimer, the term of this patent is extended or adjusted under 35 U.S.C. 154(b) by 0 days.

(21) Appl. No.: 18/903,248

(22) Filed: Oct. 1, 2024

(65) Prior Publication Data

US 2025/0126928 A1 Apr. 17, 2025

Related U.S. Application Data

(60) Provisional application No. 63/544,070, filed on Oct. 13, 2023.

(51) Int. Cl.
*H10K 30/87* (2023.01)
*H10F 19/10* (2025.01)
(Continued)

(52) U.S. Cl.
CPC ............. *H10K 30/87* (2023.02); *H10F 19/10* (2025.01); *H10F 19/31* (2025.01); *H10F 77/707* (2025.01);
(Continued)

(58) Field of Classification Search
CPC ........ H10F 77/707; H10F 19/10; H10F 19/31; H10K 30/50; H10K 30/40; H10K 30/87
See application file for complete search history.

(56) References Cited

U.S. PATENT DOCUMENTS

| | | | |
|---|---|---|---|
| 9,118,272 B2 | 8/2015 | Liao | |
| 9,252,182 B2 | 2/2016 | Knight et al. | |

(Continued)

FOREIGN PATENT DOCUMENTS

| | | | | |
|---|---|---|---|---|
| EP | 3633736 A1 | 4/2020 | | |
| WO | WO-2021124273 A1 * | 6/2021 | ........... | H10F 77/488 |

OTHER PUBLICATIONS

Jiabin Hao, et at.,"Light Trapping Effect in Perovskite Solar Cells by the Addition of Ag Nanoparticles, Using Textured Substrates", Nanomaterials 2018, 8, 815, (Oct. 10, 2018), pp. 1-12, doi:10.3390/nano8100815.

Soo Jin Kim, et al., "Geometric light trapping with a V-trap for efficient organic solar cells", Optics Express, (May 6, 2013), vol. 21, No. S3, Source PubMed, coversheet plus A305-A312 (9 sheets), doi:10.1364/OE.21.00A305.

(Continued)

*Primary Examiner* — Lindsey A Buck
(74) *Attorney, Agent, or Firm* — KATTEN MUCHIN ROSENMAN LLP

(57) ABSTRACT

A light trapping photovoltaic device includes a substrate having a top surface defining a plurality of openings, and a plurality of light trapping photovoltaic cells recessed into the substrate through the openings of the substrate. Each light trapping cell includes a first photovoltaic face and a second photovoltaic face, both of which are configured to produce electricity in response to an external light. Top edges of the first and second photovoltaic faces are disposed at a perimeter of an opening through which the light trapping cell is recessed and bottom edges of the first and second photovoltaic faces are disposed inside the opening. The first and second photovoltaic faces are inclined to each other at a predetermined angle so that the first and second photovoltaic faces are exposed to the external light through the opening.

19 Claims, 4 Drawing Sheets

(51) Int. Cl.

| | |
|---|---|
| ***H10F 19/31*** | (2025.01) |
| ***H10F 71/00*** | (2025.01) |
| ***H10F 77/20*** | (2025.01) |
| ***H10F 77/70*** | (2025.01) |
| ***H10K 30/50*** | (2023.01) |

(52) U.S. Cl.

CPC ............ *H10K 30/50* (2023.02); *H10F 71/00* (2025.01); *H10F 77/211* (2025.01)

(56) References Cited

U.S. PATENT DOCUMENTS

| | | | | |
|---|---|---|---|---|
| 2010/0282314 | A1 | 11/2010 | Coakley et al. | |
| 2012/0055537 | A1* | 3/2012 | Liao ........................ | H10F 19/10<br>136/246 |

OTHER PUBLICATIONS

Seung-Bum Rim, et al.,"An effective light trapping configuration for thin-film solar cells", American Institute of Physics, Appl. Phys. Lett. 91, 243501, (Dec. 10, 2007), 4 sheets, doi: 10.1063/1.2789677.

Dong-Lin Wang, et al.,"Highly efficient light management for perovskite solar cells," Scientific Reports, (Jan. 6, 2016), 6:18922, pp. 1-10, doi: 10.1038/srep18922.

Notification, International Search Report, and Written Opinion mailed Jan. 7, 2025, from International Patent Application No. PCT/US2024/049395, 12 sheets.

Bennett W. Schneider et al: "Pyramidal surface textures for light trapping and antireflection in perovskite-on-silicon tandem solar cells", Optics Express, vol. 22, No. S6, Oct. 20, 2014 (Oct. 20, 2014), p. A1422, CP055168169, ISSN: 1094-4087, DOI: 10.1364/OE.22.0A1422 abstract p. 3-p. 9; figure 1.

* cited by examiner

LIGHT TRAPPING DEVICE FOR THIN FILM SPACE PHOTOVOLTAICS

CROSS-REFERENCE TO RELATED APPLICATION

This application claims the benefit under 35 U.S.C. § 119(e) of provisional patent application No. 63/544,070, filed Oct. 13, 2023, the contents of which are hereby incorporated by reference.

BACKGROUND

Conventional approaches to space photovoltaics largely focus on optimal efficiency due to large launch and deployment expenses. These are most often multi-junction solar cells whose laboratory efficiencies have been improved substantially in recent years and are offered commercially with approximately 32% efficiency. Although less expensive thin film and bulk silicon technologies exist, efficiency is perhaps a factor of two lower. Still, terrestrial photovoltaics based on these semiconducting materials are behind the drive to very low-cost terrestrial photovoltaics. Indeed, terrestrial photovoltaic costs can be an astounding three orders of magnitude lower than space photovoltaic qualified multi-junction devices.

Moreover, the most widely used space photovoltaics cost approximately $200/Watt in high volumes. For a 1 megawatt system, this is hundreds of millions of dollars. The cost is largely due to complicated materials and epitaxy stacks used to form the multi-junction cells. With thin film photovoltaics those problems are avoided, and the cost is orders of magnitude lower. Unfortunately, the highest efficiency yet demonstrated is around 22% as compared to multi-junction cells at over 44%. These are not viable for creating a large amount of power in a limited area. Improving the efficiency of thin film photovoltaics such as Perovskites will substantially reduce the cost of space solar power.

SUMMARY

In order to overcome the issues described above, a combination of metrics is necessary for generating space photovoltaic power. Described here is an effective and well-controlled technique to create devices which are substantially more cost effective and scalable than existing multi-junction photovoltaics while also achieving higher efficiency with possibly better light angle sensitivity than any silicon or thin film photovoltaic approaches. Such technology is necessary, for example, for large space solar power systems. The apparatus and method of the disclosed invention are based on V-shaped and parabola-approximating structures for solar power generation not previously reported in the literature and not applied to Perovskites.

These advantages and others are achieved, for example, by a light trapping photovoltaic device that includes a substrate that has a top surface having openings that define a plurality of recesses on the top surface, and a plurality of light trapping photovoltaic cells disposed in the recesses. Each light trapping photovoltaic cell includes a plurality of photovoltaic layers configured to produce electricity in response to an external light. Each of the photovoltaic layers is inclined at a predetermined angle with respect to a normal direction of the top surface of the substrate so that a front face of each of the photovoltaic layers is exposed to the external light through the opening. The predetermined angle is greater than zero degrees and smaller than ninety degrees. Top edges of the photovoltaic layers are disposed along a perimeter of the opening defining the recess in which the light trapping photovoltaic cell is disposed. Each of the photovoltaic layers comprises perovskite.

The predetermined angle with respect to a normal direction of the top surface may be in a range of 15 to 25 degrees. Each light trapping photovoltaic cell may have an inverted pyramid shape with a base of the inverted pyramid shape corresponding to the opening defining the recess. Each light trapping photovoltaic cell may have a paraboloid shape with an aperture of the paraboloid corresponding to the opening defining the recess. Bottom edges of the photovoltaic layers may be electrically coupled to each other. The photovoltaic layers of each of the light trapping photovoltaic cells may include a first and second photovoltaic layers that directly face each other, forming a V-shape cross-section of the first and second photovoltaic layers. An angle between the first and second photovoltaic layers may be in a range of 30 to 50 degrees.

Each of the photovoltaic layers may include a photovoltaic medium layer configured to produce electricity in response to the external light, a front electrode layer disposed on a front side of the thin film photovoltaic layer, a rear electrode layer disposed on a rear side of the thin film photovoltaic layer, an anti-reflection layer disposed on a front side of the front electrode layer, and a reflective layer disposed on a rear side of the rear electrode layer. The photovoltaic medium layer may include a photovoltaic absorber, an electron transfer layer disposed on a side of the photovoltaic absorber, and a hole transfer layer disposed on an opposite side of the photovoltaic absorber. The photovoltaic absorber may include the perovskite. The reflective layer may be a Lambertian reflector that has a diffusely reflecting surface.

These advantages and others are further achieved, for example, by a method for fabricating a light trapping photovoltaic device. The method includes steps of providing a substrate, performing an anisotropic etching on a top surface of the substrate to form a plurality of recesses on the top surface, and forming a plurality of light trapping photovoltaic cells in the recesses. The step of forming a plurality of light trapping photovoltaic cells includes steps of forming a reflective layer in the recesses, forming a first electrode layer on the reflective layer, depositing a photovoltaic medium layer on the first electrode layer, forming a second electrode layer on the photovoltaic medium layer, and forming an anti-reflection layer on the second electrode layer. The photovoltaic layer is configured to produce electricity in response to an external light and includes perovskite. Each recess includes a plurality of faces. Top edges of the faces form a loop defining a perimeter of an opening of the recess. Each of the faces is inclined at a predetermined angle with respect to a normal direction of the top surface of the substrate. The predetermined angle is greater than zero degrees and smaller than ninety degrees.

The predetermined angle with respect to a normal direction of the top surface may be in a range of 15 to 25 degrees. Each recess may have an inverted pyramid shape with a base of the inverted pyramid shape corresponding to the opening of the recess. Each recess may have a paraboloid shape with an aperture of the paraboloid corresponding to the opening of the recess. The faces of each recess may include a first and second faces that directly face each other, forming a V-shape cross-section of the first and second faces. An angle between the first and second faces may be in a range of 30 to 50 degrees. The step of depositing the photovoltaic medium layer may include steps of depositing one of an electron transfer layer and a hole transfer layer on the first electrode layer, depositing a photovoltaic absorber comprising perovskite on said one of an electron transfer layer and a hole transfer layer, and depositing the other of the electron transfer layer and the hole transfer layer on the photovoltaic absorber.

BRIEF DESCRIPTION OF THE DRAWINGS

The preferred embodiments described herein and illustrated by the drawings hereinafter are to illustrate and not to limit the invention, where like designations denote like elements.

DETAILED DESCRIPTION

Figure 1:
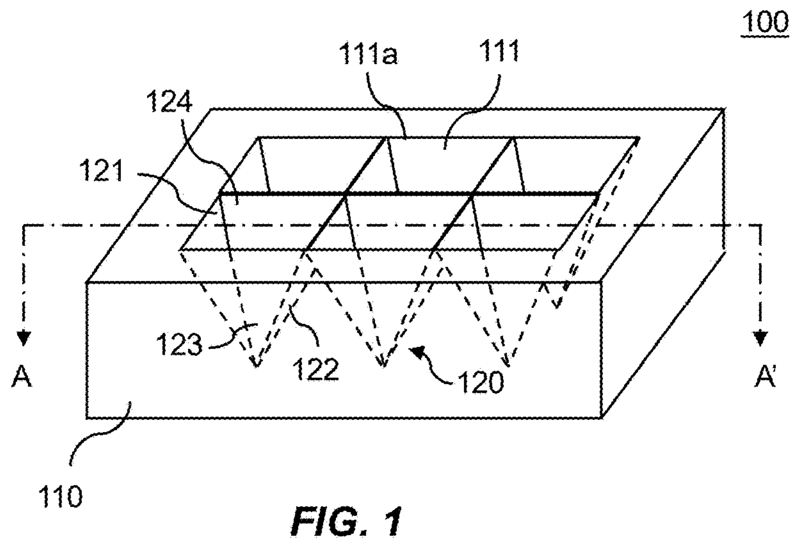
FIG. 1 is a diagram illustrating an exemplary structure of a light trapping photovoltaic device of the disclosed invention.

The following detailed description is merely exemplary in nature and is not intended to limit the described embodiments or the application and uses of the described embodiments. All of the implementations described below are exemplary implementations provided to enable persons skilled in the art to make or use the embodiments of the disclosure and are not intended to limit the scope of the disclosure, which is defined by the claims. It is also to be understood that the drawings included herewith only provide diagrammatic representations of the presently preferred structures of the present invention and that structures falling within the scope of the present invention may include structures different than those shown in the drawings.

Figure 2:
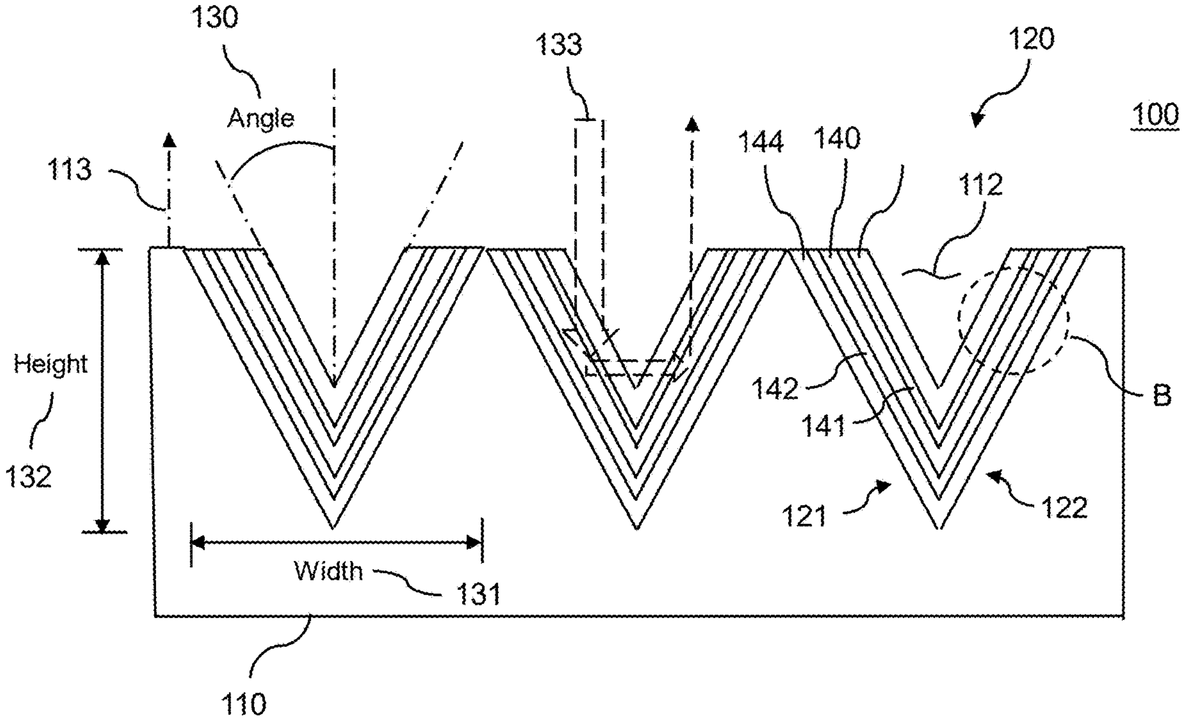
FIG. 2 is a cross-sectional view of the light trapping photovoltaic device along A-A' shown in FIG. 1.

With reference to FIG. 1, shown is an exemplary structure of the light trapping photovoltaic device 100 of the disclosed invention. With reference to FIG. 2, shown is a cross-sectional view of the light trapping photovoltaic device 100 along A-A' shown in FIG. 1. With reference to FIGS. 3A-3D, shown are exemplary structural shapes of the light trapping photovoltaic cells 120, 120*a*, 120*b*, and 120*c* that may be used for the light trapping photovoltaic device 100. For description purpose, the drawings are exaggerated. The light trapping device 100 includes substrate 110 and a plurality of light trapping photovoltaic cells 120 that are formed in the substrate 110. The top surface of the substrates 110 has a plurality of openings 11*a* that define a plurality of recesses or trap structures 111 on the top surface. The light trapping photovoltaic cells 120 are disposed in the recesses 111, and are exposed through the openings 111*a*. The substrate 110 may be a crystalline or non-crystalline substrate.

The light trapping photovoltaic cell 120 includes a plurality of lateral photovoltaic layers 121-124 that are photovoltaic members configured to produce electricity in response to an external light 133. Each of the light trapping photovoltaic cells 120 may have an inverted pyramid shape in which a base of the inverted pyramid corresponds to the opening 111*a* defining the recess 111 and the lateral faces of the inverted pyramid correspond to the lateral photovoltaic layers 121-124. The inverted pyramid shape includes an inverted square pyramid shape, an inverted pentagonal pyramid shape, an inverted hexagonal pyramid shape, etc. Additionally, each of the light trapping photovoltaic cells 120 may have a paraboloid shape with a parabola cross-section.

Figure 3A:
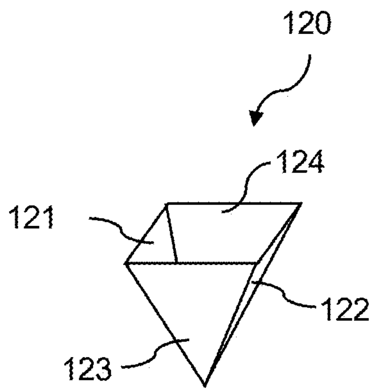
FIGS. 3A-3D are exemplary structural shapes of the light trapping photovoltaic cells that may be used for the light trapping photovoltaic device of the disclosed invention.
Figure 3B:
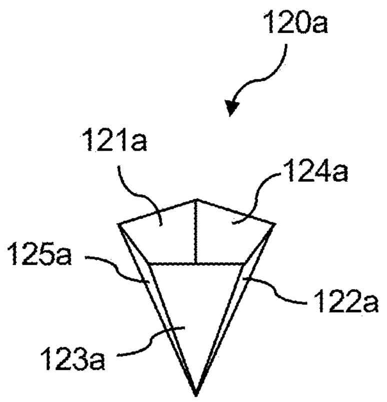
Figure 3C:
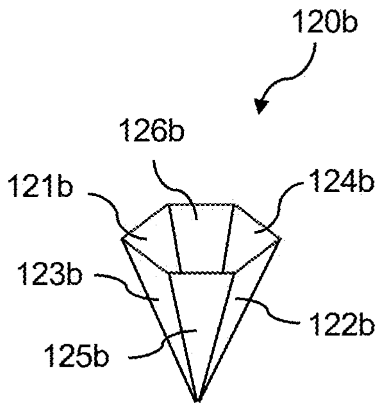
Figure 3D:
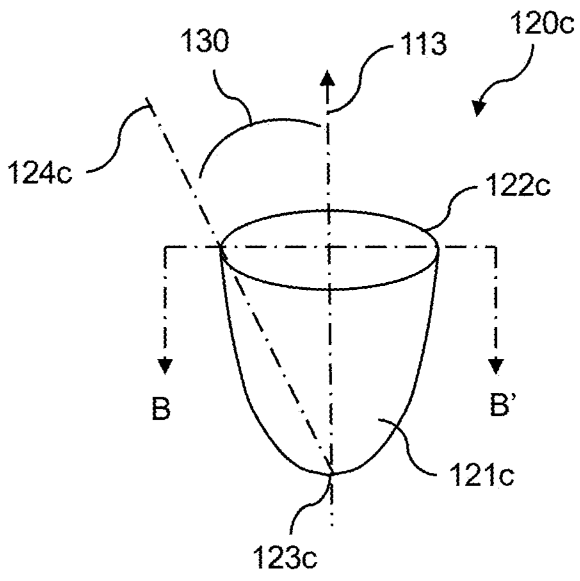

In an embodiment, the light trapping photovoltaic cells 120 may have the inverted square pyramid shape having lateral photovoltaic layers 121-124 as shown in FIG. 3A. FIGS. 1-2 exemplarily illustrate the light trapping photovoltaic cells 120 having the inverted square pyramid shape. In another embodiment, the light trapping photovoltaic cell 120*a* may have an inverted pentagonal pyramid shape having lateral photovoltaic layers 121*a*-125*a* as shown in FIG. 3B. In still another embodiment, the light trapping photovoltaic cell 120*b* may have an inverted hexagonal pyramid shape having lateral photovoltaic layers 121*b*-126*b* as shown in FIG. 3C. In still another embodiment, the light trapping photovoltaic cell 120*c* may have a paraboloid shape having a round lateral photovoltaic layer 121*c* as shown in FIG. 3D. In the light trapping photovoltaic cell 120*c*, a cross-sectional view along the line B-B' is a parabola shape. FIGS. 3A-3D show examples of the shapes of the light trapping photovoltaic cells. However, the shapes of the light trapping photovoltaic cells of the disclosed invention are not limited to the shapes as shown in FIGS. 3A-3D, but may have different shapes.

The photovoltaic layers 121-124 completely cover lateral surface of the recess 111. Therefore, top edges of the photovoltaic layers 121-124 are disposed along a perimeter of the opening 111*a* defining the recess 111 in which the light trapping photovoltaic cell 120 is disposed. In other words, the top edges of the photovoltaic layers 121-124, when combined, completely form the perimeter of the opening 111*a*. The bottom sides of the photovoltaic layers 121-124, opposite to the top edges, may form an apex portion of the inverted pyramid. In this structure, a cross-sectional view of the first and second photovoltaic layers 121, 122 may form a V-shape as shown in FIG. 2. The volume 112 defined by the lateral photovoltaic layers 121-124 may be vacuum or air, or may be filled with a transparent material such as silicon dioxide ($SiO_2$) depending on the applications of the light trapping photovoltaic device 100.

Each of the photovoltaic layers 121-124 is inclined at a predetermined angle 130 with respect to a normal direction 113 of the top surface of the substrate 110 so that a front face of each of the photovoltaic layers 121-124 is exposed to the external light 133 through the opening 111*a*. The predetermined angle 130 is greater than zero (0) degrees and smaller than ninety (90) degrees. The predetermined angle 130 may be in a range of 15 to 25 degrees. In an embodiment, the photovoltaic layers 121-124 may include a first and second photovoltaic layers 121-122 or 123-124 that directly face each other, forming a V-shape cross-section of the first and second photovoltaic layers 121-122 or 123-124. An angle between the first and second photovoltaic layers 121-122 or 123-124 may be in a range of 30 to 50 degrees. In another embodiment, the photovoltaic layer 121*c* of the light trapping photovoltaic cell 120*c* forms a parabola-approximating cross-section, as shown in FIG. 3D. In the paraboloid shape light trapping photovoltaic cells 120*c*, the predetermined angle 130 may be defined as an angle between the normal direction 113 and the line 124*c* connecting the apex 123*c* (or center point) of the paraboloid to the perimeter 122*c* of the paraboloid aperture. In still another embodiment, as shown in FIG. 3B, none of the photovoltaic layers 121*a*-125*a* of each light trapping photovoltaic cell 120*a* may directly face the other photovoltaic layers. However, the angle is not limited to these. Based on overall structure of the light trapping photovoltaic device 100, the photovoltaic layers 121-124 may be constructed to have a different predetermined angle 130.

The light trapping photovoltaic cell 120 may have dimensional features larger than the wavelength of visible light, which is around 0.5 μm, to efficiently utilize the reflection and refraction effects of the visible light. The width 131 and height 132 of the inverted pyramid structure may be in the order of microns scale. The width 131 may be no less than 0.5 μm, and the height 132 may be no less than 0.5 μm. The thickness of the photovoltaic layers 121-124 may be smaller than 0.2 μm. Each of the first and second photovoltaic layers 121, 122 may include multiple thin film layers such as a backside contact metal, a backside reflector that may be roughened to form a Lambertian reflector, the thin film perovskite photovoltaic layer that may include an absorber and any electron and hold transfer layers, and a patterned front contact and a front side anti-reflection coating.

Figure 4A:
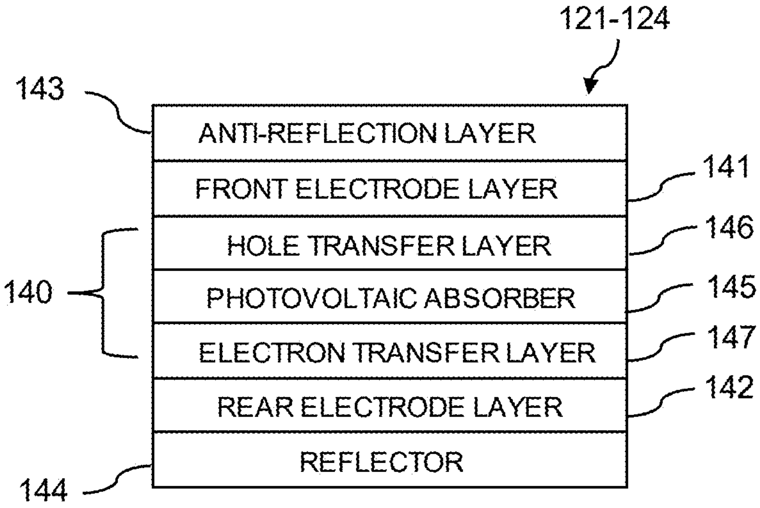
FIG. 4A is a diagram illustrating exemplary layers included in each of the photovoltaic layers of the light trapping photovoltaic cell in the portion B shown in FIG. 2.
Figure 4B:
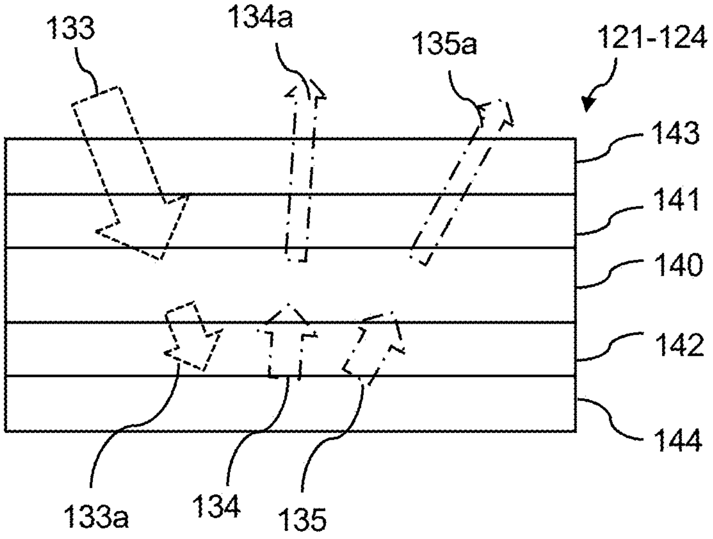
FIG. 4B is an exemplary diagram illustrating light absorption and reflection processes in the photovoltaic layer.

With reference to FIG. 4A, shown is a diagram illustrating exemplary layers included in each of the photovoltaic layers 121-124 of the light trapping photovoltaic cell 120 in the portion B shown in FIG. 2. With reference to FIG. 4B, shown is an exemplary diagram illustrating light absorption and reflection processes in the photovoltaic layer.

Each of the photovoltaic layers 121-124 includes thin film photovoltaic medium layer 140 configured to produce electricity in response to the external light 133, front electrode layer 141 disposed on the front side of the thin film photovoltaic medium layer 140, rear electrode layer 142 disposed on the rear side of the thin film photovoltaic medium layer 140, anti-reflection layer 143 disposed on the front side of the front electrode layer 141, and reflector or reflective layer 144 disposed on the rear side of the rear electrode layer 142. Herein, for description purpose, the front side is referred to as the top side of each layer, and the rear side is referred to as the bottom side of each layer.

The front and rear electrode layer 141, 142 provide electrical contact with the thin film photovoltaic medium layer 140. The front electrode layer 141 may be a patterned electrode layer. The front electrode 141 may be made of a transparent conductive material such as indium-tin-oxide (ITO). The photovoltaic layers 121-124 may be electrically coupled to each other via the front electrode layers 141 or the rear electrode layers 142. For example, the rear electrode layers 142 of the photovoltaic layers 121-124 may be electrically connected to each other, and the front electrode layers 141 of the photovoltaic layers 121-124 may be electrically connected to each other.

The backside reflector 144 may be a Lambertian reflector that has a diffusely reflecting surface. The light trapping photovoltaic cells 120 of the disclosed invention may utilize the backside Lambertian reflectors 144 in order to return uncaptured photons back into the absorbing portion of the perovskite film which may be included in the thin film photovoltaic medium layer 140. The thickness of the Lambertian reflector 144 may be on the scale less than 300 nm. This technique is especially useful for thin film photovoltaic layers and aides in the trades between thicker, more absorbing films and recombination losses.

The anti-reflection layer 143 may include various combinations of materials to maximize the anti-reflection effect based on the wavelength of the incident light 133. Refractive indexes of the materials for the anti-reflection layer 143 may be optimized based on the refractive indexes of the materials of the thin film photovoltaic medium layer 140. For instance, a dual layer antireflective coatings of silicon nitride can be used, or coatings of zinc sulfide (ZnS)/magnesium fluoride ($MgF_2$) may be used. The anti-reflective approach can be used on a larger geometric scale. The anti-reflective approach increases the efficiency by which photons enter the absorbing medium layer 140, and therefore, provides improved light trapping effect. In additions to the optimized anti-reflective coatings 143 and backside reflectors 144, light trapping can be accomplished within the absorbing layer 145 of the thin film photovoltaic medium layer 140.

The thin film photovoltaic medium layer 140 includes photovoltaic absorber 145, electron transfer layer (ETL) 147 disposed on a side of the photovoltaic absorber 145, and hole transfer layer (HTL) 146 disposed on the opposite side of the photovoltaic absorber 145. The photovoltaic absorber 145 may include perovskite. FIG. 4 exemplarily illustrates the HTL 146 disposed on the front side of the photovoltaic absorber 145 and ETL 147 on the rear side of the photovoltaic absorber 145. However, based on the doping of the photovoltaic absorber 145, the positions of the ETL 147 and HTL 146 may be switched. FIG. 4 exemplarily illustrates a single layer of the thin film photovoltaic medium layer 140. However, the thin film photovoltaic medium layer 140 may be multi-junction layers. The photovoltaic absorber 145 may include any materials that are commonly used for photovoltaic technology such as silicon, but in the disclosed invention perovskite is preferred for the material of the photovoltaic absorber 145.

Among the competing photovoltaic technologies, perovskites have become widely embraced due to several promising characteristics: (1) As a thin film technology, perovskites hold the promise of rapidly scaling to large area, light, low cost and potentially flexible arrays, (2) perovskites demonstrated efficiency of over 20% has been shown, and (3) perovskites have been shown to substantially outperform in tolerance to space radiation effects. Perovskite cells may be made in multi-junction perovskite cells to improve stability and to optimize design and improve manufacturing characteristics.

The light trapping photovoltaic device 100 of the disclosed invention provides multiple advantages beyond that possible with a planar thin film Perovskite photovoltaic. First, the amount of photovoltaic material per unit area of incident light is substantially increased. This may create not only higher efficiency of photon conversion to electricity but also may improve sensitivity with light incident at large angles. Another advantage is an increase in the number of passes of light through the thin film photovoltaic medium layer 140. Photons that are not absorbed in the first pass through the perovskite absorbing layer 145 are reflected into another direction for another opportunity to be absorbed in the thin film photovoltaic layer 145 on their way returning track though the thin film. Upon reaching the front side of the thin film photovoltaic medium layer 140, unabsorbed photons might escape the film. However, photons escaping the film have yet another opportunity to pass across the V-shape lateral layers 121-122 and become re-absorbed with another sequence of passing and reflecting from the backside reflecting surface.

For example, as shown in FIG. 4B, photons in the incident light 133 may be absorbed at the first pass in the photovoltaic medium layer 140 including the perovskite absorbing layer 145. Light 133*a* transmitted through the photovoltaic medium layer 140 is reflected at the reflector 144. By the nature of the Lambertian reflector 144 that has a diffusely reflecting surface, the reflected light 134, 135 are diffusively reflected at the reflector 144. Photons in the reflected light 134, 135 may be absorbed in the photovoltaic medium layer 140. The reflected light 134*a*, 135*a* transmitted through the photovoltaic medium layer 140 may travel to the other photovoltaic layers of the light trapping photovoltaic cell 120. Photons of the reflected light 134*a*, 135*a* may be absorbed in the photovoltaic medium layer of the other photovoltaic layers.

By these processes, the light trapping photovoltaic device 100 described here can be expected to substantially improve the external efficiency of the photovoltaic due to the increase in available photo-sensitive material and the trapping of photons. Importantly, the structure does not preclude the use of other optimizing techniques including backside reflectors, anti-reflective coatings, multi-junction absorbers, quantum dot absorbers and so on. When Perovskite is used for the thin film photovoltaic layer 123, distributed absorption may be achieved throughout the Perovskite layers.

Figure 5:
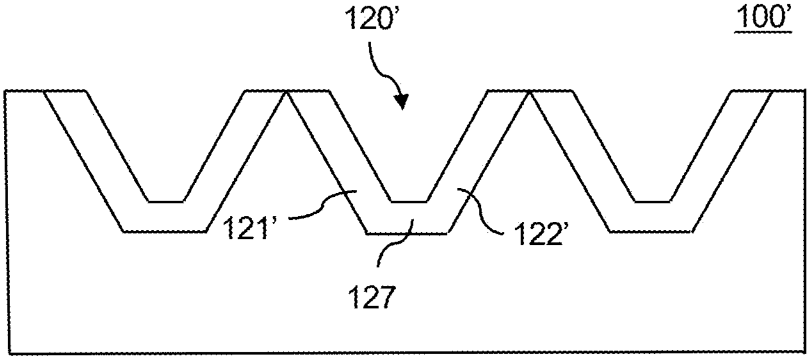
FIG. 5 is a cross-sectional view of another embodiment of the light trapping photovoltaic device of the disclosed invention.

With reference to FIG. 5, shown is a cross-sectional view of another embodiment of the light trapping photovoltaic device 100'. The structure of the light trapping device 100' is similar to the structure of the light trapping device 100, and includes substrate 110 and a plurality of light trapping photovoltaic cells 120'. The substrates 110 has a plurality of recesses or trap structures 111 formed on its the top surface, and the light trapping photovoltaic cells 120' are disposed in the recesses 111 of the substrate 110. The light trapping photovoltaic cells 120' includes lateral photovoltaic layers 121', 122' and further includes additional photovoltaic layers 127 that may be disposed on the bottom surface of the recess 111. The first and second photovoltaic layers 121', 122' are inclined to each other at a predetermined angle 130 with respect to the normal direction 113, while the additional photovoltaic layer 127 may face the opening 111*a*. The predetermined angle 130 may be in a range of 15 to 25 degrees. The layers 121', 122', and 127 are configured to produce electricity in response to the external light, and may have the layer structure shown in FIG. 4. The additional photovoltaic layer 127 may be connected to the bottom edges of the photovoltaic layers 121'-122'. FIG. 5 exemplarily shows the light trapping photovoltaic cell 120' having an inverted frustum shape which has an open base corresponding to the openings 111*a* of the substrate 110. The flat top of the frustum may correspond to the additional photovoltaic layer 127. However, the shape of the light trapping photovoltaic cells 120' may have other shapes.

Figure 6:
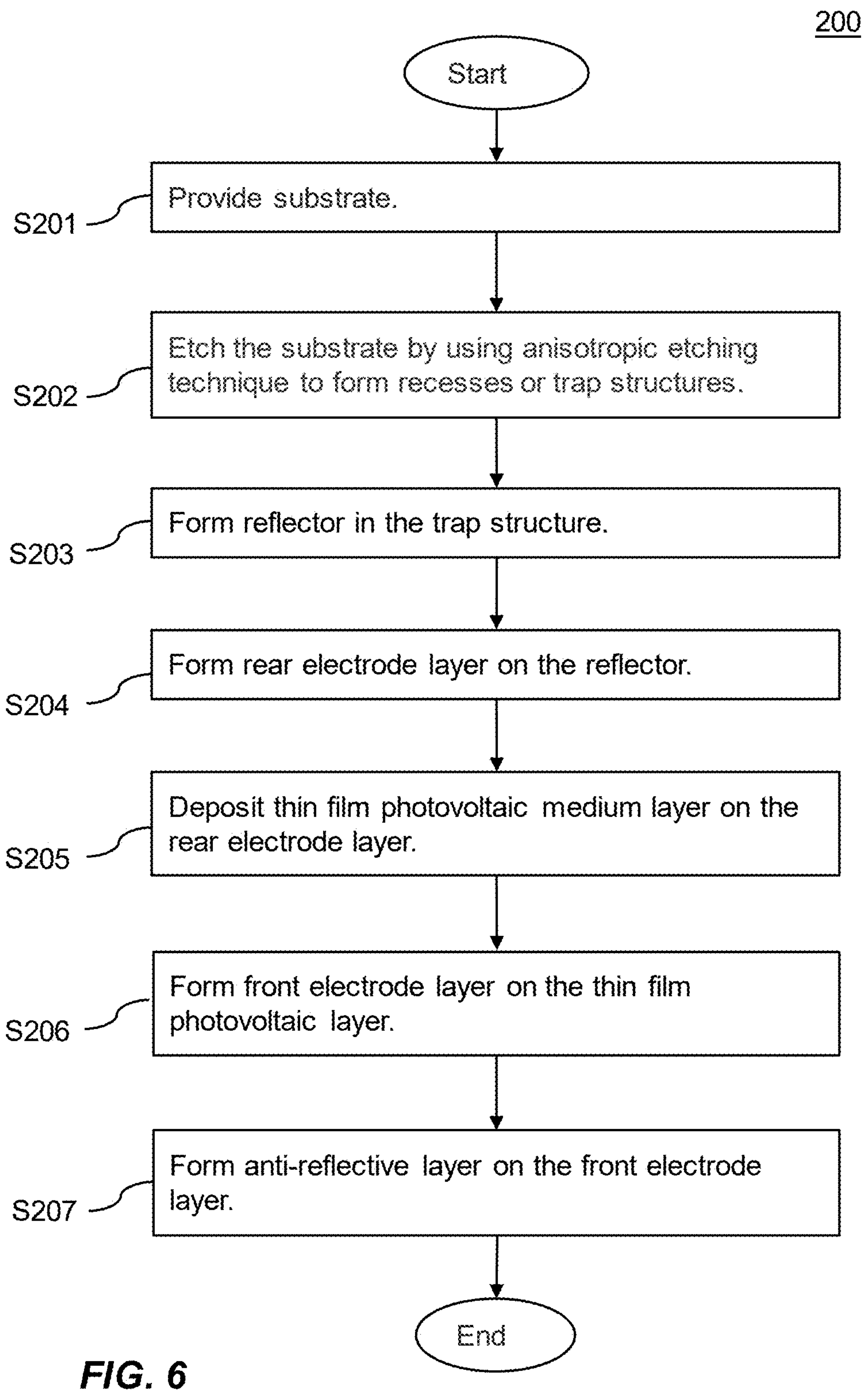
FIG. 6 is a flowchart illustrating method for fabricating the light trapping photovoltaic device of the disclosed invention.

With reference to FIG. 6, shown is a flowchart illustrating method 200 for fabricating the light trapping photovoltaic device 100 of the disclosed invention. In order to form a plurality of recesses or trap structures 111 having geometrical shapes such as inverted pyramid shapes, a crystalline substrate 110 is provided for wet etching, block S201. The substrate 110 may be a silicon substrate, but is not limited to the silicon substrate. Any substrate, including crystalline and non-crystalline substrates, may be used for the light trapping photovoltaic device 100.

Etching is performed on the substrate 110 to form recesses or trap structures 111 by using anisotropic etching technique, block S202. In general, a silicon substrate can be etched with any of a number of KOH-based wet etching materials anisotropically in directions creating well-defined, for example, steep 54.7 degrees slopes, by preferring to attack the <100> plane relative to others. Various surfactants may be used to create more complicated shapes. The orientation of the silicon and the KOH-based chemistry and conditions such as temperature may be used in conjunction with a sacrificial mask layer in order to create arrays of, for example, inverted pyramidal shapes with angles suitable to form the basis of the photovoltaic light trap structure described above.

Through etching process S202, recesses 111, including a plurality of faces, are created. Top edges of the faces of each recess 111 form a loop defining a perimeter of an opening 111*a* of the recess 111. Each of the faces is inclined at a predetermined angle 130 with respect to a normal direction 113 of the top surface of the substrate 110, where the predetermined angle 130 is greater than zero (0) degrees and smaller than ninety (90) degrees. The predetermined angle 130 with respect to a normal direction of the top surface may be in a range of 15 to 25 degrees.

Each recess 111 may have an inverted pyramid shape in which a base of the inverted pyramid corresponds to the opening 111*a* defining the recess 111 and the lateral faces of the inverted pyramid correspond to the lateral faces of the recess 111. The inverted pyramid shape includes an inverted square pyramid shape, an inverted pentagonal pyramid shape, an inverted hexagonal pyramid shape, etc. as shown in FIGS. 3A-3D. In an embodiment, faces of each recess 111 may include a first and second faces that directly face each other, forming a V-shape cross-section of the first and second faces, and an angle between the first and second faces may be in a range of 30 to 50 degrees.

After the recesses 111 are formed, a reflector or reflective layer 144 is formed inside the recesses 111, block S203, by using any known method. A rear electrode layer 142 is formed on the reflector 144, block S204, by using, for example, metal deposit method. A thin film photovoltaic medium layer 140 is deposited on the rear electrode layer 142, block S205, by using any known deposit method. A front electrode layer 141 is formed on the thin film photovoltaic medium layer 140, block S206. A front anti-reflection layer 143 is formed on the front electrode layer 141, block S207.

Coatings of these layers may be made by using typical thin film coating techniques or coating techniques that provide conformal cover for the sharp structural features of the light trapping photovoltaic cell. For example, additive manufacturing methods, such as a method for printing Perovskite solar cells on thin substrate, may be used.

Since many modifications, variations, and changes in detail can be made to the described preferred embodiments of the invention, it is intended that all matters in the foregoing description and shown in the accompanying drawings be interpreted as illustrative and not in a limiting sense. Consequently, the scope of the invention should be determined by the appended claims and their legal equivalents.

What is claimed is:

1. A light trapping photovoltaic device, comprising:

a substrate, wherein a top surface of the substrate has openings that define a plurality of recesses on the top surface, wherein the recesses comprise a plurality of walls; and a plurality of light trapping photovoltaic cells disposed on the walls of the recesses, wherein each light trapping photovoltaic cell comprises a plurality of photovoltaic layers configured to produce electricity in response to an external light, wherein:

each wall of the recesses is inclined, from a perimeter of the opening defining the recess on the top surface of the substrate, at a predetermined angle with respect to a normal direction of the top surface of the substrate so that a front face of each of the photovoltaic layers is exposed to the external light through the opening, wherein the predetermined angle is greater than zero degrees and smaller than ninety degrees;

a volume surrounded by the photovoltaic layers of each light trapping photovoltaic cell is in a vacuum state or filled with air;

top edges of the photovoltaic layers are disposed along the perimeter of the opening defining the recess in which the light trapping photovoltaic cell is disposed, and each of the photovoltaic layers comprises perovskite.

2. The light trapping photovoltaic device of claim 1 wherein the predetermined angle with respect to a normal direction of the top surface is in a range of 15 to 25 degrees.

3. The light trapping photovoltaic device of claim 1 wherein each light trapping photovoltaic cell has an inverted pyramid shape with a base of the inverted pyramid shape corresponding to the opening defining the recess.

4. A light trapping photovoltaic device, comprising:

a substrate, wherein a top surface of the substrate has openings that define a plurality of recesses on the top surface, wherein each recess has a paraboloid shape; and a plurality of light trapping photovoltaic cells disposed on surfaces of the paraboloid shapes of the recesses, wherein:

each light trapping photovoltaic cell comprises a photovoltaic layer configured to produce electricity in response to an external light, an aperture of the paraboloid shape of each recess is on the opening defining the recess on the top surface of the substrate so that a front face of each of the photovoltaic layers is exposed to the external light through the aperture, a volume inside the paraboloid shape of each light trapping photovoltaic cell is in a vacuum state or filled with air, and each photovoltaic layer comprises perovskite.

5. The light trapping photovoltaic device of claim 1 wherein bottom edges of the photovoltaic layers are electrically coupled to each other.

6. The light trapping photovoltaic device of claim 1 wherein the photovoltaic layers of each of the light trapping photovoltaic cells comprise a first and second photovoltaic layers that directly face each other, forming a V-shape cross-section of the first and second photovoltaic layers.

7. The light trapping photovoltaic device of claim 6 wherein an angle between the first and second photovoltaic layers is in a range of 30 to 50 degrees.

8. The light trapping photovoltaic device of claim 1 wherein each of the photovoltaic layers comprises:

a photovoltaic medium layer configured to produce electricity in response to the external light;

a front electrode layer disposed on a front side of the photovoltaic medium layer;

a rear electrode layer disposed on a rear side of the photovoltaic medium layer;

an anti-reflection layer disposed on a front side of the front electrode layer; and a reflective layer disposed on a rear side of the rear electrode layer.

9. The light trapping photovoltaic device of claim 8 wherein the photovoltaic medium layer comprises:

a photovoltaic absorber;

an electron transfer layer disposed on a side of the photovoltaic absorber; and a hole transfer layer disposed on an opposite side of the photovoltaic absorber.

10. The light trapping photovoltaic device of claim 9 wherein the photovoltaic absorber comprises the perovskite.

11. The light trapping photovoltaic device of claim 8 wherein the reflective layer is a Lambertian reflector that has a diffusely reflecting surface.

12. The light trapping photovoltaic device of claim 1 wherein said each light trapping photovoltaic cell further comprises an additional photovoltaic layer facing the opening, wherein the additional photovoltaic layer contacts bottom edges of the photovoltaic layers.

13. A method for fabricating a light trapping photovoltaic device, comprising:

providing a substrate;

performing an anisotropic etching on a top surface of the substrate to form a plurality of recesses on the top surface;

forming a plurality of light trapping photovoltaic cells in the recesses, comprising:

forming a reflective layer in the recesses;

forming a first electrode layer on the reflective layer;

depositing a photovoltaic medium layer on the first electrode layer to form a plurality of photovoltaic layers;

forming a second electrode layer on the photovoltaic medium layer; and forming an anti-reflection layer on the second electrode layer, wherein the top surface of the substrate has openings that define the plurality of recesses on the top surface of the substrate, wherein the recesses comprise a plurality of walls, wherein the plurality of light trapping photovoltaic cells are disposed on the walls of the recesses, wherein each light trapping photovoltaic cell comprises the plurality of photovoltaic layers configured to produce electricity in response to an external light, wherein each wall of the recesses is inclined, from a perimeter of the opening defining the recess on the top surface of the substrate, at a predetermined angle with respect to a normal direction of the top surface of the substrate so that a front face of each of the photovoltaic layers is exposed to the external light through the opening, wherein the predetermined angle is greater than zero degrees and smaller than ninety degrees, wherein a volume surrounded by the photovoltaic layers of each light trapping photovoltaic cell is in a vacuum state or filled with air, wherein top edges of the photovoltaic layers are disposed along the perimeter of the opening defining the recess in which the light trapping photovoltaic cell is disposed, and wherein each of the photovoltaic layers comprises perovskite.

14. The method of claim 13 wherein the predetermined angle with respect to a normal direction of the top surface is in a range of 15 to 25 degrees.

15. The method of claim 13 wherein each recess has an inverted pyramid shape with a base of the inverted pyramid shape corresponding to the opening of the recess.

16. The method of claim 13 wherein said depositing the photovoltaic medium layer comprises:

depositing one of an electron transfer layer and a hole transfer layer on the first electrode layer;

depositing a photovoltaic absorber comprising perovskite on said one of an electron transfer layer and a hole transfer layer; and depositing the other of the electron transfer layer and the hole transfer layer on the photovoltaic absorber.

17. The method of claim 13 wherein the photovoltaic layers of each of the light trapping photovoltaic cells comprise a first and second photovoltaic layers that directly face each other, forming a V-shape cross-section of the first and second photovoltaic layers.

18. The method of claim 17 wherein an angle between the first and second photovoltaic layers is in a range of 30 to 50 degrees.

19. The method of claim 13 wherein the reflective layer is a Lambertian reflector that has a diffusely reflecting surface.

* * * * *